(12) United States Patent
Teshome

(10) Patent No.: US 6,219,255 B1
(45) Date of Patent: Apr. 17, 2001

(54) METHOD AND APPARATUS FOR REDUCING EMI IN A COMPUTER SYSTEM

(75) Inventor: Abeye Teshome, Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/137,472

(22) Filed: Aug. 20, 1998

(51) Int. Cl.[7] .............................. H05K 1/11; H05K 9/00
(52) U.S. Cl. .................. 361/794; 361/777; 361/780; 361/818; 333/12; 333/246; 174/255; 174/261; 29/846
(58) Field of Search ................................ 361/748, 777, 361/778, 780, 794, 818; 174/250, 253, 255, 261; 333/12, 24 R, 32, 33, 99 R, 246, 247; 257/728; 29/830, 831, 846

(56) References Cited

U.S. PATENT DOCUMENTS

| | | | |
|---|---|---|---|
| 4,942,400 | * 7/1990 | Tarzaiski et al. | 174/261 |
| 4,954,929 | * 9/1990 | Baran | 361/794 |
| 5,263,868 | * 11/1993 | Renn et al. | 439/67 |
| 5,336,095 | * 8/1994 | Walburn et al. | 439/67 |
| 5,418,691 | * 5/1995 | Tokura | 361/803 |
| 5,428,191 | * 6/1995 | Chandler et al. | 174/261 |
| 5,812,039 | * 9/1998 | Oldfield | 333/246 |

* cited by examiner

Primary Examiner—Jeffrey Gaffin
Assistant Examiner—John B. Vigushin
(74) Attorney, Agent, or Firm—Haynes and Boone, L.L.P.

(57) ABSTRACT

A computer system includes a microprocessor, an an input coupled to provide signal inputs to the microprocessor, a mass storage coupled to the microprocessor, a video controller for coupling the microprocessor to a display, a memory coupled to provide storage to facilitate execution of computer programs by the microprocessor, and a multilayer printed circuit board for mounting the microprocessor thereon. The multilayer printed circuit board provides for reduced electromagnetic interference (EMI) and includes at least two layers. The multilayer printed circuit board further includes a first conductive segment on a first layer, a second conductive segment on the first layer, the second segment being separated from the first segment by a primary gap, and a conductive interconnect on a second layer, the interconnect for carrying a high frequency signal therein. The second layer is disposed laterally from and substantially parallel to the first layer. The interconnect is further disposed for crossing over the first segment to the second segment in a cross-over region and wherein the first segment and the second segment are further characterized by a secondary gap in the cross-over region, the secondary gap being less than the primary gap for providing an increased coupling in the cross-over region. A method for reducing a source of EMI in a multilayer printed circuit board is also disclosed.

51 Claims, 5 Drawing Sheets

METHOD AND APPARATUS FOR REDUCING EMI IN A COMPUTER SYSTEM

BACKGROUND OF THE INVENTION

1. Field of the Invention

The present invention relates generally to computer systems, and more particularly, to a method and apparatus for reducing electromagnetic interference in a printed circuit board, or the like, of a computer system.

2. Discussion of the Related Art

Discontinuities in signal paths of high speed return currents on a printed circuit board are a potential source for generation of electromagnetic interference (EMI) radiation and noise coupling. In addition, EMI radiation and noise coupling can cause undesirable adverse operation of circuit on the printed circuit board. A method and apparatus for reducing the undesired EMI interference and noise coupling is thus desired.

Figures 1, 2:
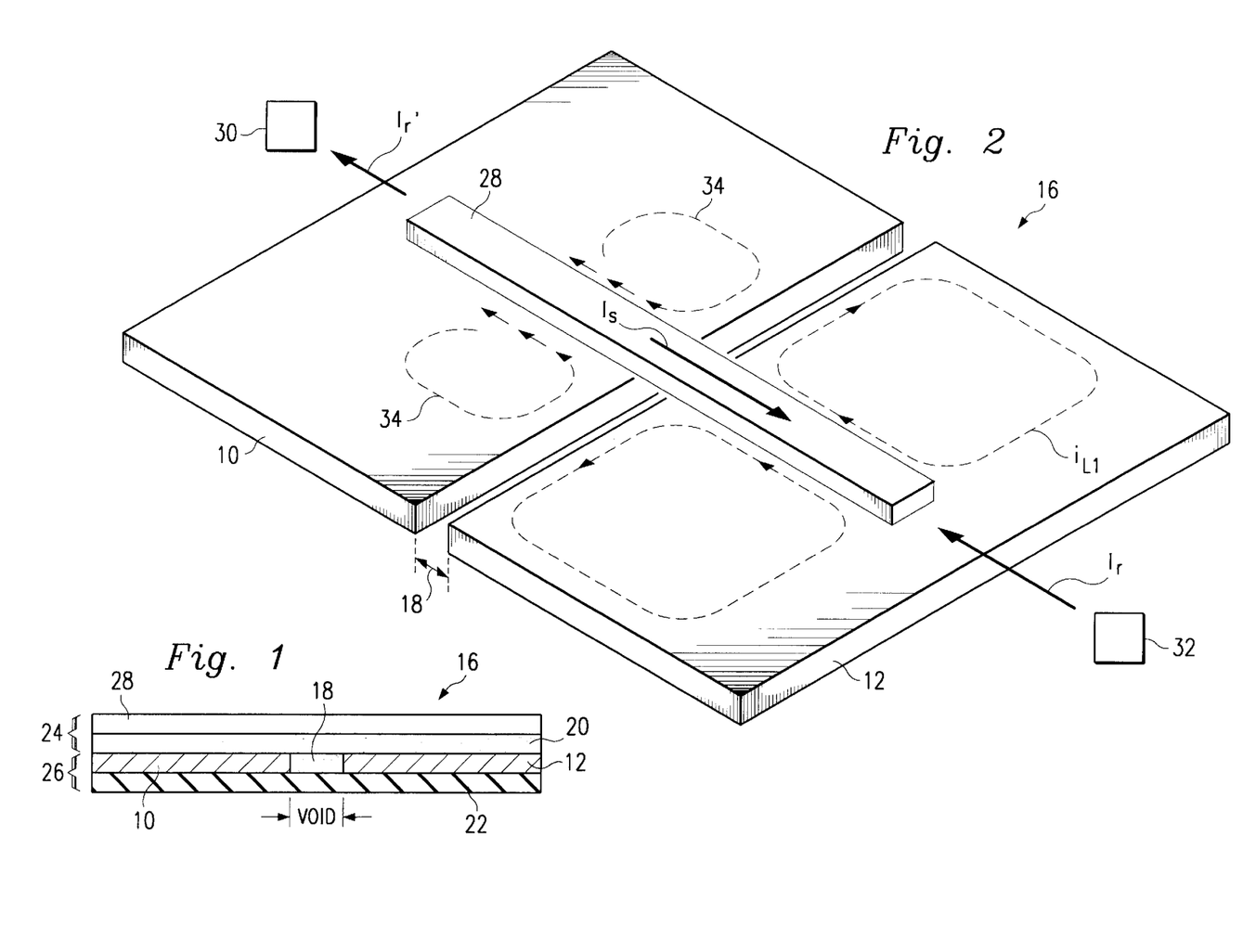
FIG. 1 illustrates a cross-sectional view of a multilayer printed circuit board.
FIG. 2 is an isometric view of a first segment, a second segment, and an interconnect of the multilayer printed circuit board of FIG. 1.

With respect to multilayer printed circuit boards, for example, as shown in FIG. 1, segmenting of a conductive layer (10, 12) on an insulative layer 14 of the multilayered printed circuit board 16 may be done. Segmenting involves the dividing up of a planar conductive layer into physically separated segments, for example, segments 10 and 12. In other words, each segment is physically separated from one another by a void or an insulative material 18. The segments could be electrically connected via a capacitor or the like. A typical conductive plane which is segmented includes, for example, copper (Cu).

The segmenting of the conductive layer on a plane can be implemented for various reasons. One reason may include providing a power or reference plane having two different voltages. For example, a first segment 10 may be used to carry a 3.3 v reference voltage. A second segment 12 may be used to carry a 5.0 v reference voltage. In such a situation where the two segments are at different voltages, the segments must be physically separated. In other words, a physical void or insulative material 18 exists between segments. Multilayered printed circuit board often refers to printed circuit boards having two or more conductive circuits, wiring or segmented layers separated by one or more insulative layers 20, 22. Segmented layers could be included on any one of the conductive layers, as needed for a particular printed circuit board implementation.

While segmenting has been discussed with respect to a voltage plane, a ground plane could be segmented also. In such an instance, one ground plane segment could represent a ground plane for digital circuitry, the digital circuitry being characterized as noisy. Another ground plane segment could represent a quiet ground plane. The two ground plane segments are physically separated to maintain their respective characteristics, i.e., so that noise from the noisy ground plane segment does not bleed into the quiet ground plane segment. As discussed herein, plane segmentation can be done for a power plane, a ground plane, or any other reference plane.

In addition, to the above, multilayer printed circuit boards include several layers of laminated material, for example, layers 24, 26 including conductive and insulative materials. Any one layer may include one or more reference segments, signal lines, and/or circuit portions. Furthermore, a single layer can include more than one segment. As discussed, the segments of any particular layer may include voltage or power plane segments, ground plane segments, or any combination of reference plane segments. A signal layer can also include a reference segment on the signal layer.

A problem arises when there are two different segments on a given plane of a multilayer printed circuit board 16 and an interconnect 28 in a second plane traverses over a boundary of a first segment 10 and a second segment 12. The interconnect 28 can be situated in a layer above or below the first and second segments. Furthermore, the interconnect 28 is separated from the first and second segments by an insulative layer material 20. If we assume that a driver 30 is situated on the side of the first segment 10 and connected via the interconnect 28 to a receiver 32 situated on the side of the second segment 12, then a signal current, $I_s$, is driven through the interconnect 28. As the signal current travels down the interconnect 28, there are two things that happen. First, the impedance of the interconnect 28 determines how smoothly the signal current $I_s$ will travel down the interconnect across the underlying segments. Note that the segments may alternatively be overlying segments. Secondly, considering for a moment small crosssections of the interconnect, from the driver 30 to the receiver 32, the impedance of the individual cross-sections drastically changes in the region of the void 18 between the first segment 10 and the second segment 12. In other words, a portion of the interconnect in the region of the void 18 between the first segment 10 and the second segment 12 encounters a drastic change of impedance.

Over the first segment 10, the interconnect impedance is referenced with respect to the first segment. As a high speed or high frequency signal travels from the driver 30 to the receiver 32, two things occur. That is, first, there is a change in impedance in the region of the void 18 between the first segment and the second segment. Such a change in impedance will have an adverse effect upon the high speed signal current, $I_s$, and the corresponding voltage waveform that traverses the interconnect. The high speed signal may include, for example, a 6 MHz, 8 MHz, 33 MHz, 66 MHz, 100 MHz, or any other, repetitive, periodic, or pseudo-periodic signal having a high frequency. A pseudo-periodic signal is characterized by a signal that appears periodic for certain durations and non-periodic for other durations. Secondly, in response to the signal current, $I_s$, there exists a return current, $I_r$, which travels along the segments of the reference plane. That is, when the signal current, $I_s$, travels down the interconnect 28, there is a return current, $I_r$.

The return current $I_r$ is dissipated along the return path through the segments into various return currents and loop currents as shown in FIG. 2. Considering a cross-section of the interconnect 28 above the second segment 12, the return current (density) follows a normal distribution curve just under the cross-section of the interconnect. The majority of the return current for the high speed signal, will reside underneath the interconnect above the second segment. The return current will try to follow the route of the interconnect 28, which is true for high speed signals but not true for DC signals. In other words, the return current, $I_r$, tries to return to the driver 30 or source via the segments of the reference plane. As the return current, $I_r$, reaches the void 18 between the second segment 12 and the first segment 10, the return current, $I_r$, encounters a "brick wall." The "brick wall" represents the void 18 where there is no physical connection between the second segment 12 and the first segment 10. The majority, or a high magnitude, of the return current will try to go across a face of the respective segment. In essence, however, the majority of return current creates a loop current $i_{L1}$ to each side of the interconnect 28 within the second segment 12. A pitfall of such a created loop current is that any circuit elements or circuits in the proximity of the created loop current, above or below, can be adversely affected in an undesirable manner. The loop current $i_{L1}$ is created because the return current $I_r$ cannot couple from the second segment 12 to the first segment 10 and go back to the source 30 (i.e., the driver). Undesired coupling of the loop current with circuit elements or circuits in a proximity of the loop current in one or more adjacent layers can thus occur. With electromagnetic interference (EMI), if a cable attachment (not shown) is in proximity to the loop current $i_{L1}$ the cable extending perhaps out to or from a chassis, connector, keyboard, or other device, then the loop current $i_{L1}$ could undesirably couple onto the cable. Coupling of the loop current onto the cable can result in the cable acting as an antenna, the loop current acting to drive the antenna. Unwanted EMI noise is thus added to the operation of the nearby circuit or signal line, whatever the circuit or signal line happens to be. Given that the signal $I_s$ of the interconnect 28 is a high speed periodic or pseudo-periodic signal, EMI noise created as a result of the strong loop current $i_{L1}$ can be detected outside the multilayer printed circuit board 16. In other words, a cable or wire being driven by the fairly strong loop current acts as an antenna and starts radiating EMI noise. In a given frequency range, the EMI noise can be detected with a receiver, such as at the fundamental or a harmonic of the high speed signal frequency.

A very small portion of the return current will couple $I_r'$ onto the first segment 10. The relative strengths of the return loop current $i_{L1}$ and coupled return current $I_r'$ are illustrated with a solid line and dotted line, respectively, as shown in FIG. 2. The magnitude of return current $I_r'$ which is coupled onto the first segment is much less or at a lower magnitude than the return loop current $I_r$. The coupling of current from the second segment to the first segment is due to an inductive coupling that exists between two parallel planes, that is, a mutual inductance. Secondly, a coupling of the return current is also due to a mutual capacitance that exists between the second segment and the first segment. The current $I_r'$ which is coupled to the first segment 10 will travel to the source or driver 30 to complete the return loop, i.e. return current signal from the receiver to the driver.

As mentioned, a main problem with the embodiment as shown in FIG. 2, is that any cables and/or circuits proximate to the region of the void between the second and first segments can be adversely affected or undesirably influenced. That is, any circuits and/or cables proximate the return current loop $i_{L1}$ (of return current that has not coupled onto the first segment) will be adversely affected. Still further, spurious undesired noise can adversely affect circuits in the region proximate the void and elsewhere on the multilayer printed circuit board. The problem may include either a functional problem or an EMI problem, or both.

While the first and second segments could be capacitively coupled to one another via a discrete capacitor, such capacitive coupling may not always be feasible and/or desired. Capacitive coupling furthermore adds to the expense of manufacturing of a particular multilayer printed circuit board. A solution for EMI reduction without the use of discrete capacitors is desired.

SUMMARY OF THE INVENTION

According to one embodiment, a method for reducing a source of electromagnetic interference (EMI) in a multilayer printed circuit board having at least two layers includes the following steps. A first conductive segment is provided on a first layer. A second conductive segment is also provided on the first layer, wherein the second segment is separated from the first segment by a primary gap. Lastly, a conductive interconnect is provided on a second layer, wherein the interconnect is for carrying a high frequency signal therein and the second layer is disposed laterally from and substantially parallel to the first layer. The interconnect is further disposed for crossing over the first segment to the second segment in a cross-over region, wherein the first segment and the second segment are further characterized by a secondary gap in the cross-over region. The secondary gap is made to be less than the primary gap for providing a localized increased coupling in the cross-over region.

In another embodiment, the method further includes providing in the cross-over region that the first segment and the second segment are further characterized by an interlocking arrangement.

In yet another embodiment, the method further includes providing in the cross-over region that the first segment and the second segment are further characterized by a non-interlocking arrangement.

Still further, according to another embodiment of the present disclosure, a multilayer printed circuit board provides for reduced electromagnetic interference (EMI) and has at least two layers. The multilayer printed circuit board includes a first conductive segment on a first layer, a second conductive segment on the first layer, and a conductive interconnect on a second layer, wherein the second layer is disposed laterally from and substantially parallel to the first layer. The second segment is separated from the first segment by a primary gap. The interconnect is for carrying a high frequency signal therein. The interconnect is further disposed for crossing over the first segment to the second segment in a cross-over region and wherein the first segment and the second segment are further characterized by a secondary gap in the cross-over region, the secondary gap being less than the primary gap for providing a localized increased coupling in the cross-over region.

Yet still further, a computer system includes a microprocessor, an input coupled to provide signal inputs to the microprocessor, a mass storage coupled to the microprocessor, a video controller for coupling the microprocessor to a display, a memory coupled to provide storage to facilitate execution of computer programs by the microprocessor, and a multilayer printed circuit board for mounting the microprocessor thereon. The multilayer printed circuit board provides for reduced electromagnetic interference (EMI) and includes at least two layers. The multilayer printed circuit board further includes a first conductive segment on a first layer, a second conductive segment on the first layer, the second segment being separated from the first segment by a primary gap, and a conductive interconnect on a second layer, the interconnect for carrying a high frequency signal therein. The second layer is disposed laterally from and substantially parallel to the first layer. The interconnect is further disposed for crossing over the first segment to the second segment in a cross-over region and wherein the first segment and the second segment are further characterized by a secondary gap in the cross-over region, the secondary gap being less than the primary gap for providing a localized increased coupling in the cross-over region.

In another embodiment, in the cross-over region on the multilayer printed circuit board, the first segment and the second segment are further characterized by an interlocking arrangement.

In yet another embodiment, in the cross-over region on the multilayer printed circuit board, the first segment and the second segment are further characterized by a non-interlocking arrangement.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

The method and apparatus of the present disclosure increase a capacitive and an inductive coupling between a first segment and a second segment in a localized manner. More particularly, the localized capacitive and inductive coupling occurs in the region of an interconnect traversing over (or under) a void or gap between the first segment and the second segment as will be discussed further herein below. Such a void may include air or any suitable insulative material.

The present method and apparatus enables a multilayer printed circuit board manufacturer to lessen or reduce the use of discrete capacitive devices for capacitively coupling of first and second segments as discussed herein.

Figures 3, 3A:
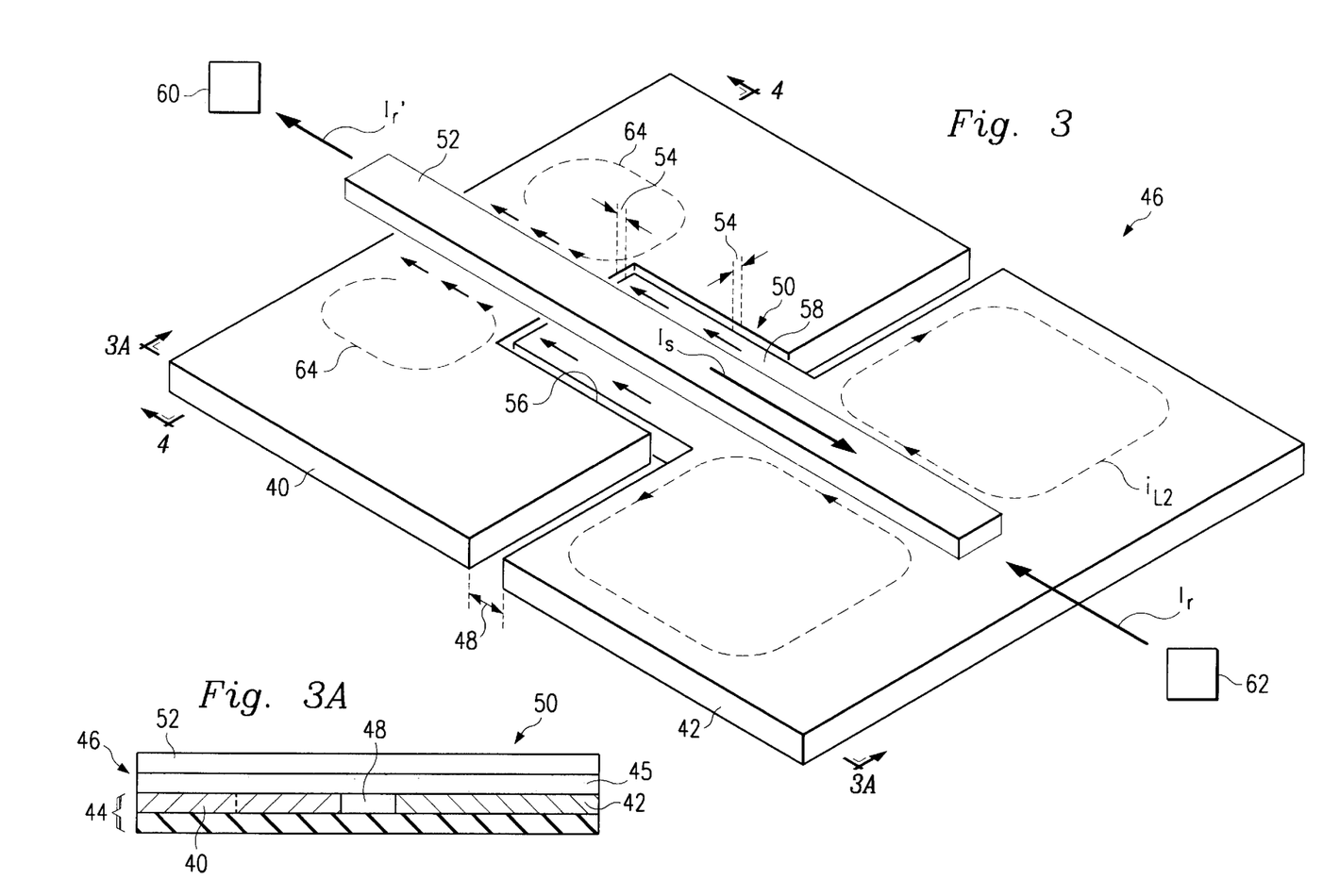
FIG. 3 is an isometric view of a first segment, a second segment, and an interconnect of a multilayer printed circuit board including a cross-over region of localized increased coupling having an interlocking arrangement according to the method and apparatus of the present disclosure
FIG. 3A illustrates a cross-sectional view of the multilayer printed circuit board of FIG. 3.

Referring now to FIGS. 3 and 3A, according to the method and apparatus of the present disclosure, a first segment 40 and a second segment 42 are provided upon a layer 44 of a multi-layered printed circuit board 46. The first segment 40 and the second segment 42 are separated from one another by a principal void or primary gap 48. However, in a cross-over region 50 where an interconnect 52 crosses over (or under) from the first segment 40 to the second segment 42, an area of localized increased coupling is provided as will be further defined and discussed herein.

First, by increasing a surface area of the two segments in the vicinity of the interconnect cross-over region 50, where the interconnect 52 crosses over from the first segment 40 to the second segment 42, the coupling region is advantageously locally increased. The amount of coupling is further increased through providing a secondary gap 54 between the first segment 40 and the second segment 42 in the region of the interconnect cross-over 50. That is, the secondary gap 52 includes a width dimension which is less than the width dimension of the primary gap 48 between the first segment 40 and the second segment 42. In other words, in the region 50 where the interconnect passes over from one segment to the other, the secondary gap 54 is made to be smaller than the primary gap 48 or void in other regions. In one embodiment, the secondary gap 54 is on the order of ten to seventy-five percent (10–75%) of the primary gap 48. In another embodiment, the secondary gap 54 is on the order of twenty percent (20%) of the primary gap 48. Preferably, the secondary gap 54 is much much smaller than the primary gap 48. In one embodiment, the primary gap is on the order of 20 mils and the secondary gap is on the order of 5 mils. In addition, coupling area around the cross-over region 50 is further increased by the use of a localized mating and/or counterpart segment features (56, 58) in the first and second segments (40, 42), respectively. The localized mating and/or counterpart features provide corresponding paired segment shapes in the first and second segments to assist in helping concentrate current in such a manner so as to locally increase coupling in the cross-over region 50. The further increase in coupling surface area results from the presence of localized mating and/or counterpart features of the first and second segments, respectively.

As shown in FIG. 3, the second segment 42 includes a square or rectangle protrusion feature 58 or tab which protrudes into a square or rectangle mating inlet feature 56 of the first segment 40. The two segments are thus locked together at the respective protrusion and inlet features in an interlocked arrangement. In other words, the area of localized increased coupling between the first segment 40 and the second segment 42 includes the mating or counterpart features and/or selected portions of the respective segments.

With respect to a first segment 40 in the region 50 where the interconnect traverses the cross-over from the first segment to the second segment, there is a mating feature 56 on the first segment. A corresponding mating feature 58 is included on the second segment 42 for mating with the mating feature 56 of the first segment 40. As discussed, the mating features of the first and second segments provide for an increased surface area available for coupling of the first segment with the second segment in the cross-over region. Both capacitive and inductive coupling are advantageously increased in a localized region of the mating features.

Referring still to FIG. 3, a driver 60 is provided for driving a periodic or pseudo-periodic signal via the interconnect 52 to a receiver 62. Signal current, $I_s$, flows from the driver 60 to the receiver 62. Considering a cross-section of the interconnect 52 over the secondary gap 54, since the secondary gap 54 is much much smaller than the primary gap 48, the portion of the interconnect 52 which is affected with respect to an impedance discontinuity would be a very small fraction of the interconnect. That is, the impedance discontinuity would be limited to a very small fraction of the interconnect in the embodiment of FIG. 3, further which is significantly lower with respect to the effect on impedance discontinuity in connection with gap 18 of FIG. 2. The greatly reduced impedance discontinuity helps with signal current propagation, in addition to a voltage waveform which is propagated by the interconnect 52.

With respect to the return current, $I_r$, the following discussion is provided. The shape of the mating features (56, 58) of the first segment 40 and the second segment 42 assist and/or help concentrate the return current density in the cross-over region 50. By increasing the surface area of the coupling, and while decreasing the gap (i.e., the secondary gap in comparison to the primary gap) in the cross-over region 50, the two segments are thus physically closer together just in the area of the cross-over region 50. As a result, localized inductive and capacitive coupling that will exist between the two segments in the cross-over region 50 are greatly enhanced.

The secondary gap 54 preferably extends about the mating features or portions of each segment, where the secondary gap 54 is less than the primary gap 48. In one embodiment, the secondary gap 54 is held a constant gap. (See FIGS. 3, 5, 6, and 7). In another embodiment the secondary gap 54 is a variable gap, ranging from a minimum gap to a maximum gap, wherein the maximum gap is less than the primary gap 48. (See FIG. 8).

In the geometry shown in FIG. 3, the increase in surface area available for coupling of the first segment 40 with the second segment 42 in the cross-over region 50 is accomplished through the sides of the mating features (56, 58) of the respective segments. The geometry of the mating features (56, 58) further are used for providing a maximized area for coupling between the first segment 40 and the second segment 42 in the cross-over region 50.

Figure 4:
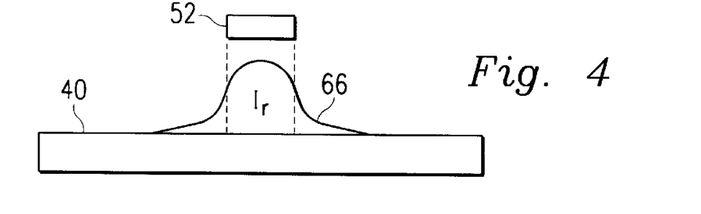
FIG. 4 illustrates a return current distribution of return current for any high speed signal current according to the method and apparatus of the present disclosure.

Benefits of the mating features (56, 58) include the fact that more of the return current $I_r$ is captured and coupled from the second segment 42 to the first segment 40. The mating features (56, 58) help create a higher localized current density in the region of the mating features. In addition, the mating features (56, 58) create an efficient coupling mechanism between the two segments. Thus, the majority of the return current $I_r$ is able to couple from the second segment 42 onto the first segment 40 and to continue on its return path to the driver (or source) 60. There will be some current (i.e. at a significantly reduced magnitude) which creates a secondary loop 64 in the first segment 40. The formation of return current is more or less like a normal distribution 66 and the tail ends of the current distribution 66 form the secondary current loops 64 at a significantly reduced magnitude than the current loops 34 as illustrated in FIG. 2. FIG. 4 illustrates return current distribution 66 between the interconnect 52 and the first segment 40. Any relative effect of the secondary return current loops is substantially reduced or minimized also.

With reference again to the secondary gap 54, the secondary gap 54 has an impact upon the capacitive effect, i.e. with a decrease in distance, between mating features (56, 58) of the segments in the cross-over region 50. That is, as the secondary gap 54 distance decreases, there is a corresponding increase in coupling efficiency and capacitive effects. The increase in capacitive effects further aids in a capacitive coupling between the first and second segments in the cross-over region 50. In addition, the mutual inductance will also increase. In this manner, coupling is made more efficient. Furthermore, a higher coupled current density also results based on the shape or geometry of the mating region. The geometry or shape of the mating features further helps concentrate the current density.

Figure 5:
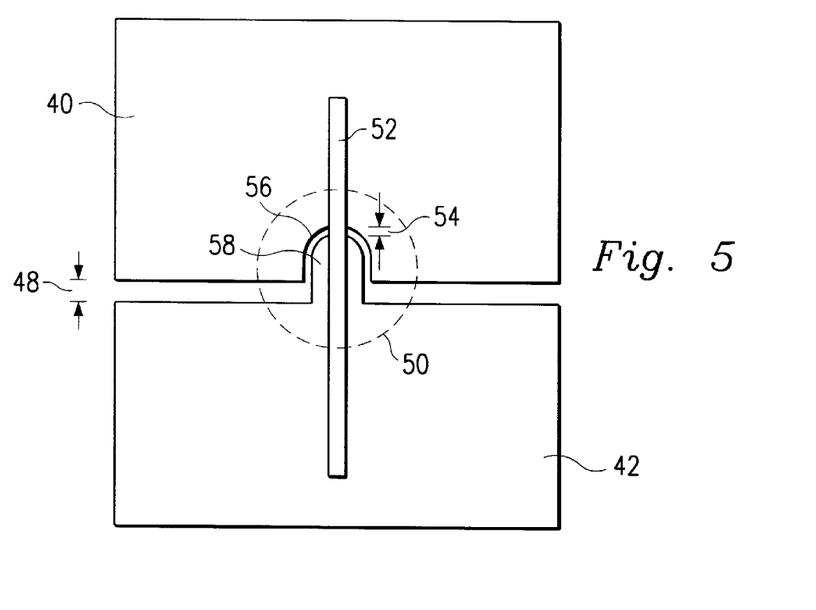
FIG. 5 is a diagramatic top view illustrating an embodiment of the cross-over region including an interlocking arrangement with circular shaped mating features.

While the mating features (56, 58) of FIG. 3 represent square or rectangular features, other geometries are possible. For example, as shown in FIG. 5, circular or elliptical shaped mating features (56, 58) in the cross-over region 50 are contemplated. The secondary gap 54 is maintained much less than the primary gap 48. The embodiment of FIG. 5 is further characterized as an interlocking arrangement. Note that the extent to which the mating feature 58 of the second segment 42 extends or interlocks in to the region of feature 56 of first segment 40 may be selected as desired to further provide a prescribed localized coupling amount.

Figure 6:
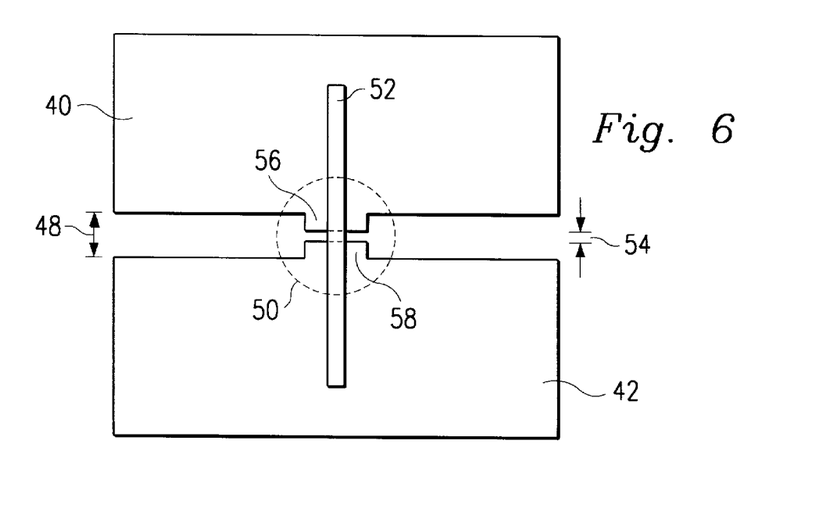
FIG. 6 is a diagramatic top view illustrating an embodiment of the cross-over region including a non-interlocking arrangement with rectangular shaped counterpart features.

In addition to the interlocking arrangement, a non-interlocking arrangement is also possible as shown in FIG. 6. In the cross-over region 50 of FIG. 6, a portion or feature 56 of the first segment 40 necks down to a neck down portion or feature 58 of the second segment 42. The neck down portions or features (56, 58) include a square or rectangular shape. The secondary gap 54 exists between the neck down portions (56, 58) of the first and second segments (40, 42) as shown. The primary gap 48 exists in areas not occupied by the neck down portions. With the non-interlocking arrangement, the gap between the first segment 40 and the second segment 42 is decreased, that is, the secondary gap 54 is much less than the primary gap 48, with no further increase in the surface area available for coupling purposes. Coupling efficiency, however, is increased through the non-interlocking arrangement, resulting in an increased return current density in the localized region 50 of the non-interlocking arrangement.

Figure 7:
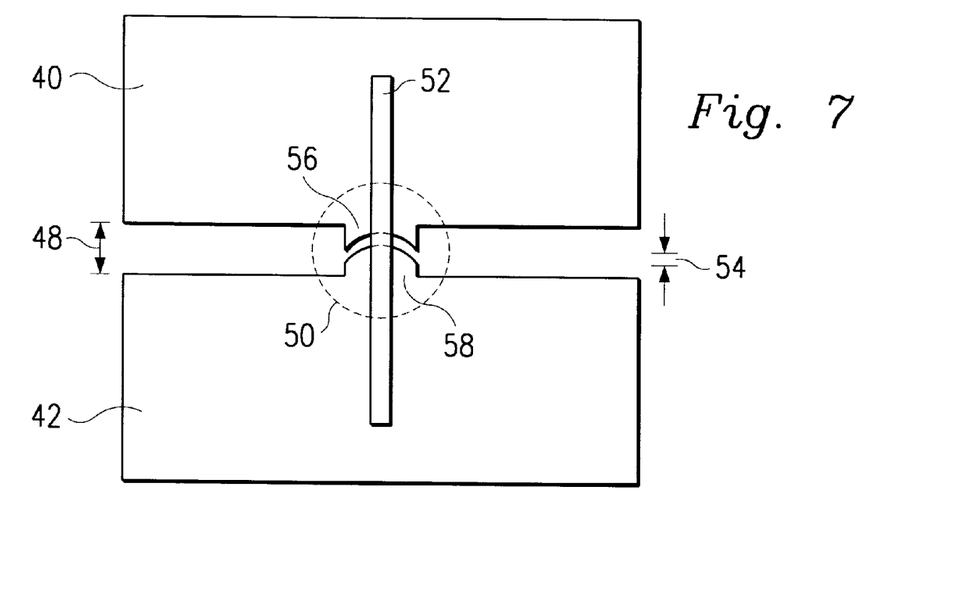
FIG. 7 is a diagramatic top view illustrating an embodiment of the cross-over region including a non-interlocking arrangement with circular shaped mating features.
Figure 8:
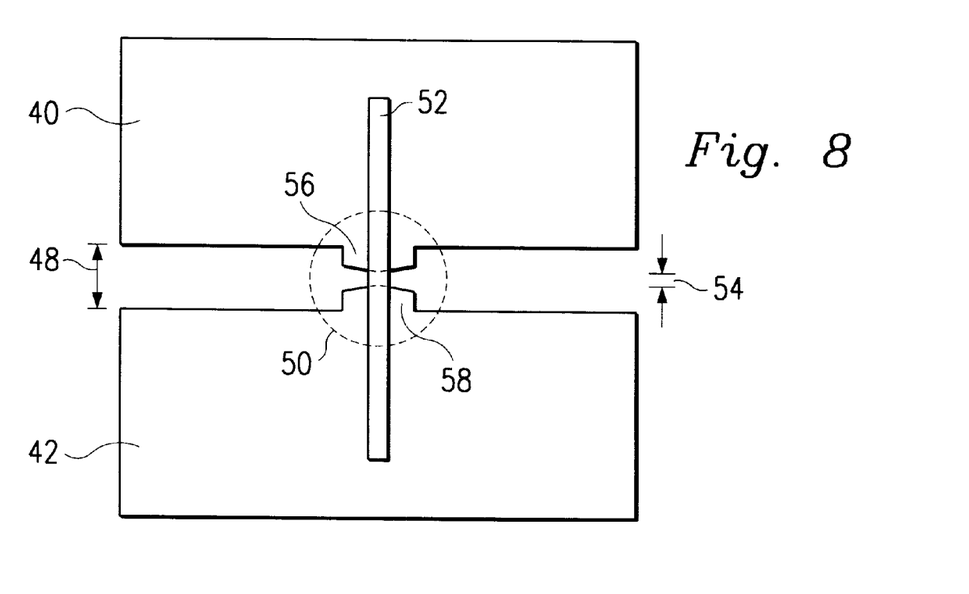
FIG. 8 is a diagramatic top view illustrating an embodiment of the cross-over region including a non-interlocking arrangement with triangular shaped counterpart features.

Alternate non-interlocking coupling arrangements are illustrated in FIGS. 7 and 8. In FIG. 7, the neck down portions or features (56, 58) of the first segment 40 and the second segment 42 include circular shapes. The secondary gap 54 is established between the non-interlocking mating circular portions (56, 58) of the neck down features in the cross-over region 50. In FIG. 8, the neck down portions or features (56, 58) of the first segment 40 and the second segment 42 include triangular shapes. The secondary gap 54 is established between the non-interlocking mating triangular portions of the neck down features in the cross-over region 50. Note that in FIG. 8, the secondary gap 54 is less than the primary gap 48, and further wherein the secondary gap 54 is varied from a minimum secondary gap value at the center of the neck down feature to a maximum secondary gap value at an edge of the neck down feature. In addition, the spacing of the features from one another may also be on the order of less than or equal to the secondary gap. In another embodiment, one neck down feature 56 could be mated with a neck down feature 58 of a shape different from the first neck down feature. For example, the feature 56 could include a circular shape as shown in FIG. 7, while the feature 58 could include a triangular shape as shown in FIG. 8.

The interlocking arrangement of mating features may include any number of various geometries, so long as the overall effect of the geometries increases the localized coupling of the first and second segments in the cross-over region. Surface area available for coupling is increased while the secondary gap between the first and second segments in the cross-over region is made much smaller than the primary gap. Again, the cross-over region 50 is that region here the interconnect 52 crosses over (or under) the gap between the first segment 40 and the second segment 42, the interconnect further being separated from the plane of the first and second segments by an insulative layer 45 (FIG. 3A). The interconnect 52 may be included on any layer of a multilayer printed circuit board 46.

Figure 9:
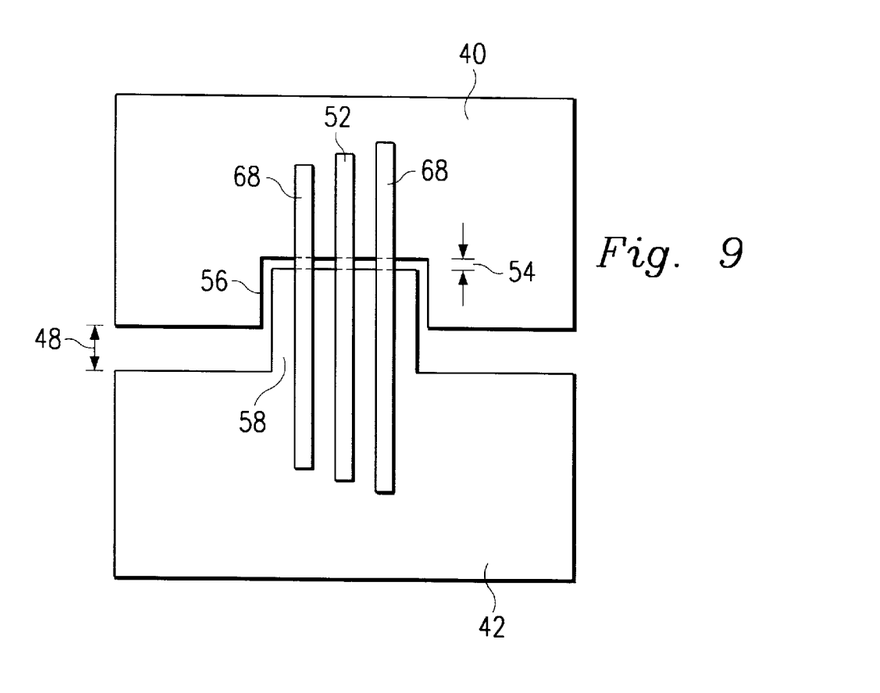
FIG. 9 is a diagramatic top view illustrating an embodiment of the cross-over region including an interlocking arrangement with rectangular shaped mating features further including at least one floating interconnect in addition to the high frequency signal interconnect.

Turning now to FIG. 9, another alternate embodiment includes the interlocking arrangement of FIG. 3 in addition to additional floating interconnects 68 (or dead interconnects). The floating interconnects 68 run parallel to the live or true interconnect 52 in the same plane. Preferably, the floating interconnects 68 are not connected to any further circuitry, signal lines, or segments. The floating interconnects 68 run parallel to the live interconnect, in addition to extending over the gap between the first segment and the second segment in the cross-over region 50. The floating interconnects 68 provide additional coupling to the live interconnects. Lastly, the floating interconnects extend over the first and second segments by a prescribed amount, according to the particular coupling requirements of a multilayer printed circuit board application. The extension of the floating interconnect 68 by a prescribed amount is preferably less than a distance of the live interconnect 52 extending between a driver 60 and a receiver 62. In addition to the coupling benefits provided by the interlocking arrangement and the secondary gap, the floating interconnects 68 further assures a desired coupling for the return current. In particular, the floating interconnect 68 further increases a capacitive coupling between the first and second segments. At least one floating interconnect 68 is provided, such as shown in the arrangement illustrated in FIG. 9.

In operation, as shown in the embodiment of FIG. 3, the return current is referenced by $I_r$. The return loop current, $I_{L2}$ is a much much lower magnitude than the loop current $I_{L1}$ of FIG. 2. Currents which are a derivative of $I_r$ are illustrated by $I_r'$. At the source 60, the magnitude of the return current would be different in the illustration of FIGS. 2 and 3. That is, the magnitude of the return current $I_r'$ at the source 60 in FIG. 3 would be much higher than the magnitude of the return current $I_r'$ at the source 30 in FIG. 2. The magnitude of the return current at the source in FIG. 3 is a result of the efficient localized coupling stemming from the interlocking embodiment and the lesser amount of return current that gets wasted, i.e., which forms loop current $I_{L2}$. In the embodiment of FIG. 2, coupling between the first and second segments is not efficient, thus the magnitude of the loop current $I_{L1}$ is much much higher than the magnitude of the loop current $I_{L2}$ of FIG. 3. In FIG. 2, the magnitude of return current coupled to the first segment is much less than the magnitude of $I_r$ due to the loss of return current in the loop $I_{L1}$ over the second segment, in addition to the lack of sufficient coupling between the first and second segments.

In FIG. 3, with the interlocking arrangement, some amount of secondary current loop 64 is generated in the first segment 40, as illustrated and previously discussed. However, a large amount of the magnitude of the return current $I_r$ is returned to the source. Because of coupling efficiency provided by the embodiments of the present disclosure, the magnitude of $I_r'$ is substantially on the order of the magnitude of return current $I_r$.

As shown in FIG. 3, return current $I_r$ traverses in a direction along the mating interlocking feature/arrangement of the second segment to the first segment. The return current couples to the first segment 40 across the secondary gap 54. The magnitude of the return current right after the secondary gap 54 would be of a little lower magnitude than before the secondary gap 54. After the secondary gap 54, a minor portion of the coupled return current forms secondary loop currents 64, the secondary loop currents 64 having a much lower magnitude (i.e., much much less than $I_r$) than the coupled return current $I_r'$. Note also that the secondary loop currents 64 of FIG. 3 are much much less than secondary loop currents 34 of FIG. 2. With the embodiments of the present disclosure, the return current is thus mostly coupled as desired and travels via the return path into the first segment to the driver or source. The secondary loop currents 64 in the first segment are minimally influenced by loop currents $i_{L2}$ in the second segment 42. This is to be contrasted with FIG. 2, in which loop currents 34 in the first segment 10 have magnitudes which are influenced by the loop currents $i_{L1}$ of the second segment 12. Such large secondary return current loops 34 present similar problems as discussed with respect to the large current loops $i_{L1}$ of the second segment 12. The secondary current loops 34 in the first segment 10 of FIG. 2 are impacted by the loop currents $i_{L1}$ in the second segment 12.

In FIG. 3, the majority of coupling occurs in the localized region 50 of the secondary void or gap 54 of the interlocking arrangement, between the first segment and second segment, which is further upstream from the primary void or gap 48. In addition, the coupling also occurs further away from the minimal loop currents $i_{L2}$ in the second segment 42. By the time that secondary loop currents 64 form on the first segment 40, a substantial return path has already established itself in the first segment. An insignificant portion of return current thus forms the secondary current loops 64 in the first segment 40. As mentioned above, contrast the secondary current loops 64 of FIG. 3 to the secondary current loops 34 of FIG. 2. Recall that in FIG. 2, the secondary current loops 34 are greatly influenced by the high magnitude of return loop currents $i_{L1}$ in the second segment 12.

With the interlocking embodiments of the present disclosure, coupling occurs away from the primary gap or void 48, further away from the return current loops $i_{L2}$ formed in the second segment 42. The actual secondary loop currents 64 which form on the first segment 40 are also much narrower loops. The secondary loops 64 of FIG. 3 thus have a decreased loop area and a lower current magnitude in comparison with the secondary loops 34 of FIG. 2. The higher magnitude, coupled return current $I_r'$ of FIG. 3 is now more in alignment in proximity under the interconnect than previously possible, for example, as compared with the embodiment of FIG. 2.

The present embodiment advantageously shortens the return current loops $i_{L2}$ in the second segment 42 and the secondary return current loops 64 in the first segment 40 as shown in FIG. 3. In addition, the present embodiments increase the amount or magnitude of return current $I_r$ coupled from the second segment 42 to the first segment 40, providing an increased magnitude in the coupled return current $I_r'$ which is further in alignment with the direction of the interconnect 52 in comparison with the embodiment of FIG. 2.

With diminished return current loops $i_{L2}$ in the second segment 42, adverse EMI, unwanted noise coupling, or other functional disruption with circuits, signal lines, etc., in the region proximate to the interconnect cross-over are significantly reduced or kept to a minimum.

Figure 10:
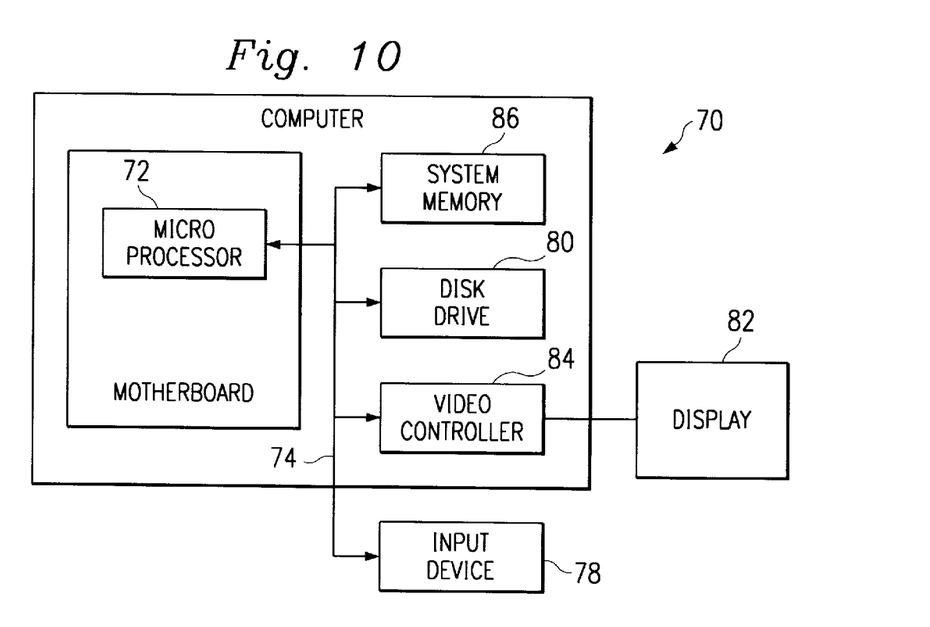
FIG. 10 illustrates an embodiment of a computer system including a multilayer printed circuit board according to the method and apparatus of the present disclosure.

With reference now to FIG. 10, a computer system 70 includes a microprocessor 72 which is connected to a bus 74. The microprocessor is coupled to a motherboard 76, the motherboard including a multilayer printed circuit board 46 as discussed herein above. Bus 74 serves as a connection between microprocessor 72 and other components of computer system 70. An input device 78 is coupled to microprocessor 72 to provide input to microprocessor 72. Examples of input devices include keyboards, touch screens, and pointing devices, such as, a mouse, a trackball, and a touch pad, or the like. Programs and data are stored on a mass storage device 80, which is also coupled to microprocessor 72. Mass storage devices include such devices as hard disk drives, optical disk drives, magneto-optical drives, floppy disk drives, and the like. Computer system 70 further includes a display 82, which is coupled to microprocessor 72 by a video controller 84. A system memory 86 is coupled to microprocessor 72 to provide the microprocessor with fast storage to facilitate execution of computer programs by microprocessor 72. It should be understood that other buses and intermediate circuits can be deployed between the components described above and microprocessor 72 to facilitate interconnection between the components and the microprocessor.

While the invention has been particularly shown and described with reference to the preferred embodiment thereof, it will be understood by those skilled in the art that various changes in form and detail may be made therein without departing form the spirit and scope of the invention, as set forth in the following claims.

What is claimed is:

1. A multilayer printed circuit board disposed for reducing a source of electromagnetic interference (EMI) and having at least two layers, said multilayer printed circuit board comprising:
    a first conductive segment on a first layer;
    a second conductive segment on the first layer, said second segment being separated from said first segment by a primary gap; and
    a conductive interconnect on a second layer, said interconnect for carrying a high frequency signal therein, the second layer being disposed laterally from and substantially parallel to the first layer, said interconnect further being disposed for crossing over said first segment to said second segment in a cross-over region and wherein said first segment and said second segment are further characterized by a secondary gap in the cross-over region, the secondary gap being less than the primary gap for providing an increased coupling in the cross-over region.

2. The multilayer printed circuit board of claim 1, wherein in the cross-over region, said first segment and said second segment are further characterized by an interlocking arrangement.

3. The multilayer printed circuit board of claim 2, wherein the interlocking arrangement further includes rectangular shaped mating features, said first segment including a first mating feature and said second segment including a second mating feature, the first and second mating features being spaced apart from one another by a spacing on the order of the secondary gap.

4. The multilayer printed circuit board of claim 3, further comprising at least one floating conductive interconnect on the second layer in addition to said high frequency signal interconnect, said at least one floating interconnect being disposed substantially parallel to said high frequency signal interconnect and for crossing over said first segment to said second segment in the cross-over region.

5. The multilayer printed circuit board of claim 2, wherein the interlocking arrangement further includes circular shaped mating features, said first segment including a first mating feature and said second segment including a second mating feature, the first and second mating features being spaced apart from one another by a spacing on the order of the secondary gap.

6. The multilayer printed circuit board of claim 5, further comprising at least one floating conductive interconnect on the second layer in addition to said high frequency signal interconnect, said at least one floating interconnect being disposed substantially parallel to said high frequency signal interconnect and for crossing over said first segment to said second segment in the cross-over region.

7. The multilayer printed circuit board of claim 2, wherein the interlocking arrangement further includes first and second counterpart features, said first segment including the first counterpart feature and said second segment including the second counterpart feature, the first and second counterpart features being spaced apart from one another by a spacing on the order of less than or equal to the secondary gap.

8. The multilayer printed circuit board of claim 7, further comprising at least one floating conductive interconnect on the second layer in addition to said high frequency signal interconnect, said at least one floating interconnect being disposed substantially parallel to said high frequency signal interconnect and for crossing over said first segment to said second segment in the cross-over region.

9. The multilayer printed circuit board of claim 1, wherein the secondary gap is on the order of ten to seventy-five percent (10–75%) of the primary gap.

10. The multilayer printed circuit board of claim 9, further wherein the secondary gap is on the order of twenty percent (20%) of the primary gap.

11. The multilayer printed circuit board of claim 1, wherein in the cross-over region, said first segment and said second segment are further characterized by a non-interlocking arrangement.

12. The multilayer printed circuit board of claim 11, wherein the non-interlocking arrangement further includes rectangular shaped mating features, said first segment including a first mating feature and said second segment including a second mating feature, the first and second mating features being spaced apart from one another by a spacing on the order of the secondary gap.

13. The multilayer printed circuit board of claim 12, further comprising at least one floating conductive interconnect on the second layer in addition to said high frequency signal interconnect, said at least one floating interconnect being disposed substantially parallel to said high frequency signal interconnect and for crossing over said first segment to said second segment in the cross-over region.

14. The multilayer printed circuit board of claim 11, wherein the non-interlocking arrangement further includes circular shaped mating features, said first segment including a first mating feature and said second segment including a second mating feature, the first and second mating features being spaced apart from one another by a spacing on the order of the secondary gap.

15. The multilayer printed circuit board of claim 14, further comprising at least one floating conductive interconnect on the second layer in addition to said high frequency signal interconnect, said at least one floating interconnect being disposed substantially parallel to said high frequency signal interconnect and for crossing over said first segment to said second segment in the cross-over region.

16. The multilayer printed circuit board of claim 11, wherein the non-interlocking arrangement further includes first and second counterpart features, said first segment including the first counterpart feature and said second segment including the second counterpart feature, the first and second counterpart features being spaced apart from one another by a spacing on the order of less than or equal to the secondary gap.

17. The multilayer printed circuit board of claim 16, further comprising at least one floating conductive interconnect on the second layer in addition to said high frequency signal interconnect, said at least one floating interconnect being disposed substantially parallel to said high frequency signal interconnect and for crossing over said first segment to said second segment in the cross-over region.

18. A computer system comprising:
a microprocessor;
an input coupled to provide signal inputs to said microprocessor;
a mass storage coupled to said microprocessor;
a video controller for coupling said microprocessor to a display;
a memory coupled to provide storage to facilitate execution of computer programs by said microprocessor; and
a multilayer printed circuit board for mounting said microprocessor thereon, said multilayer printed circuit board providing for reduced electromagnetic interference (EMI) and having at least two layers, further including a first conductive segment on a first layer, a second conductive segment on the first layer, the second segment being separated from the first segment by a primary gap, and a conductive interconnect on a second layer, the interconnect for carrying a high frequency signal therein, the second layer being disposed laterally from and substantially parallel to the first layer, the interconnect further being disposed for crossing over the first segment to the second segment in a cross-over region and wherein the first segment and the second segment are further characterized by a secondary gap in the crossover region, the secondary gap being less than the primary gap for providing an increased coupling in the cross-over region.

19. The system of claim 18, wherein in the cross-over region, the first segment and the second segment are further characterized by an interlocking arrangement.

20. The system of claim 19, wherein the interlocking arrangement further includes rectangular shaped mating features, the first segment including a first mating feature and the second segment including a second mating feature, the first and second mating features being spaced apart from one another by a spacing on the order of the secondary gap.

21. The system of claim 20, further comprising at least one floating conductive interconnect on the second layer in addition to the high frequency signal interconnect, the at least one floating interconnect being disposed substantially parallel to the high frequency signal interconnect and for crossing over the first segment to the second segment in the cross-over region.

22. The system of claim 19, wherein the interlocking arrangement further includes circular shaped mating features, the first segment including a first mating feature and the second segment including a second mating feature, the first and second mating features being spaced apart from one another by a spacing on the order of the secondary gap.

23. The system of claim 22, further comprising at least one floating conductive interconnect on the second layer in addition to the high frequency signal interconnect, the at least one floating interconnect being disposed substantially parallel to the high frequency signal interconnect and for crossing over the first segment to the second segment in the cross-over region.

24. The system of claim 19, wherein the interlocking arrangement further includes first and second counterpart features, the first segment including the first counterpart feature and the second segment including the second counterpart feature, the first and second counterpart features being spaced apart from one another by a spacing on the order of less than or equal to the secondary gap.

25. The system of claim 24, further comprising at least one floating conductive interconnect on the second layer in addition to the high frequency signal interconnect, the at least one floating interconnect being disposed substantially parallel to the high frequency signal interconnect and for crossing over the first segment to the second segment in the cross-over region.

26. The system of claim 18, wherein the secondary gap is on the order of ten to seventy-five percent (10–75%) of the primary gap.

27. The system of claim 26, further wherein the secondary gap is on the order of twenty percent (20%) of the primary gap.

28. The system of claim 18, wherein in the cross-over region, the first segment and the second segment are further characterized by a non-interlocking arrangement.

29. The system of claim 28, wherein the non-interlocking arrangement further includes rectangular shaped mating features, the first segment including a first mating feature and the second segment including a second mating feature, the first and second mating features being spaced apart from one another by a spacing on the order of the secondary gap.

30. The system of claim 29, further comprising at least one floating conductive interconnect on the second layer in addition to the high frequency signal interconnect, the at least one floating interconnect being disposed substantially parallel to the high frequency signal interconnect and for crossing over the first segment to the second segment in the cross-over region.

31. The system of claim 28, wherein the non-interlocking arrangement further includes circular shaped mating features, the first segment including a first mating feature and the second segment including a second mating feature, the first and second mating features being spaced apart from one another by a spacing on the order of the secondary gap.

32. The system of claim 31, further comprising at least one floating conductive interconnect on the second layer in addition to the high frequency signal interconnect, the at least one floating interconnect being disposed substantially parallel to the high frequency signal interconnect and for crossing over the first segment to the second segment in the cross-over region.

33. The system of claim 28, wherein the non-interlocking arrangement further includes first and second counterpart features, the first segment including the first counterpart feature and the second segment including the second counterpart feature, the first and second counterpart features being spaced apart from one another by a spacing on the order of less than or equal to the secondary gap.

34. The system of claim 33, further comprising at least one floating conductive interconnect on the second layer in addition to the high frequency signal interconnect, the at least one floating interconnect being disposed substantially parallel to the high frequency signal interconnect and for crossing over the first segment to the second segment in the cross-over region.

35. A method for reducing a source of electromagnetic interference (EMI) in a multilayer printed circuit board, the multilayer printed circuit board having at least two layers, said method comprising the steps of:
providing a first conductive segment on a first layer;
providing a second conductive segment on the first layer, the second segment being separated from the first segment by a primary gap; and
providing a conductive interconnect on a second layer, the interconnect for carrying a high frequency signal therein, the second layer being disposed laterally from and substantially parallel to the first layer, the interconnect further being disposed for crossing over the first segment to the second segment in a cross-over region and wherein the first segment and the second segment are further characterized by a secondary gap in the cross-over region, the secondary gap being less than the primary gap for providing an increased coupling in the cross-over region.

36. The method of claim 35, wherein in the cross-over region, the first segment and the second segment are further characterized by an interlocking arrangement.

37. The method of claim 36, wherein the interlocking arrangement further includes rectangular shaped mating features, the first segment including a first mating feature and the second segment including a second mating feature, the first and second mating features being spaced apart from one another by a spacing on the order of the secondary gap.

38. The method of claim 37, further comprising the step of providing at least one floating conductive interconnect on the second layer in addition to the high frequency signal interconnect, the at least one floating interconnect being disposed substantially parallel to the high frequency signal interconnect and for crossing over the first segment to the second segment in the cross-over region.

39. The method of claim 36, wherein the interlocking arrangement further includes circular shaped mating features, the first segment including a first mating feature and the second segment including a second mating feature, the first and second mating features being spaced apart from one another by a spacing on the order of the secondary gap.

40. The method of claim 39, further comprising the step of providing at least one floating conductive interconnect on the second layer in addition to the high frequency signal interconnect, the at least one floating interconnect being disposed substantially parallel to the high frequency signal interconnect and for crossing over the first segment to the second segment in the cross-over region.

41. The method of claim 36, wherein the interlocking arrangement further includes first and second counterpart features, the first segment including the first counterpart feature and the second segment including the second counterpart feature, the first and second counterpart features being spaced apart from one another by a spacing on the order of less than or equal to the secondary gap.

42. The method of claim 41, further comprising the step of providing at least one floating conductive interconnect on the second layer in addition to the high frequency signal interconnect, the at least one floating interconnect being disposed substantially parallel to the high frequency signal interconnect and for crossing over the first segment to the second segment in the cross-over region.

43. The method of claim 35, wherein the secondary gap is on the order of ten to seventy-five percent (10–75%) of the primary gap.

44. The method of claim 43, further wherein the secondary gap is on the order of twenty percent (20%) of the primary gap.

45. The method of claim 35, wherein in the cross-over region, the first segment and the second segment are further characterized by a non-interlocking arrangement.

46. The method of claim 45, wherein the non-interlocking arrangement further includes rectangular shaped mating features, the first segment including a first mating feature and the second segment including a second mating feature, the first and second mating features being spaced apart from one another by a spacing on the order of the secondary gap.

47. The method of claim 46, further comprising the step of providing at least one floating conductive interconnect on the second layer in addition to the high frequency signal interconnect, the at least one floating interconnect being disposed substantially parallel to the high frequency signal interconnect and for crossing over the first segment to the second segment in the cross-over region.

48. The method of claim 45, wherein the non-interlocking arrangement further includes circular shaped mating features, the first segment including a first mating feature and the second segment including a second mating feature, the first and second mating features being spaced apart from one another by a spacing on the order of the secondary gap.

49. The method of claim 48, further comprising the step of providing at least one floating conductive interconnect on the second layer in addition to the high frequency signal interconnect, the at least one floating interconnect being disposed substantially parallel to the high frequency signal interconnect and for crossing over the first segment to the second segment in the cross-over region.

50. The method of claim 45, wherein the non-interlocking arrangement further includes first and second counterpart features, the first segment including the first counterpart feature and the second segment including the second counterpart feature, the first and second counterpart features being spaced apart from one another by a spacing on the order of less than or equal to the secondary gap.

51. The method of claim 50, further comprising the step of providing at least one floating conductive interconnect on the second layer in addition to the high frequency signal interconnect, the at least one floating interconnect being disposed substantially parallel to the high frequency signal interconnect and for crossing over the first segment to the second segment in the cross-over region.

* * * * *